United States Patent
Peidous et al.

(10) Patent No.: US 7,456,058 B1
(45) Date of Patent: Nov. 25, 2008

(54) STRESSED MOS DEVICE AND METHODS FOR ITS FABRICATION

(75) Inventors: Igor Peidous, Fishkill, NY (US); Linda R. Black, Wappingers Falls, NY (US); Huicai Zhong, Wappingers Falls, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 496 days.

(21) Appl. No.: 11/231,405

(22) Filed: Sep. 21, 2005

(51) Int. Cl.
*H01L 21/338* (2006.01)

(52) U.S. Cl. .................. 438/182; 438/574; 438/585
(58) Field of Classification Search .............. 438/182, 438/574, 585
See application file for complete search history.

(56) References Cited

U.S. PATENT DOCUMENTS 7,148,145 B2 * 12/2006 Wieczorek et al. .......... 438/692

* cited by examiner

*Primary Examiner*—Jack Chen
(74) *Attorney, Agent, or Firm*—Ingrassia Fisher & Lorenz, P.C.

(57) ABSTRACT

Stressed MOS devices and methods for their fabrication are provided. The stressed MOS device comprises a T-shaped gate electrode formed of a material having a first Young's modulus. The T-shaped gate electrode includes a first vertical portion and a second horizontal portion. The vertical portion overlies a channel region in an underlying substrate and has a first width; the horizontal portion has a second greater width. A tensile stressed film is formed overlying the second horizontal portion, and a material having a second Young's modulus less than the first Young's modulus fills the space below the second horizontal portion. The tensile stressed film imparts a stress on the horizontal portion of the gate electrode and this stress is transmitted through the vertical portion to the channel of the device. The stress imparted to the channel is amplified by the ratio of the second width to the first width.

4 Claims, 3 Drawing Sheets though the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

STRESSED MOS DEVICE AND METHODS FOR ITS FABRICATION

TECHNICAL FIELD OF THE INVENTION

The present invention generally relates to MOS devices and to methods for their fabrication, and more particularly relates to stressed MOS devices and their fabrication.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions.

The gain of an MOS transistor, usually defined by the transconductance ($g_m$), is proportional to the mobility of the majority carrier in the transistor channel. The current carrying capability and hence the performance of an MOS transistor is proportional to the mobility of the majority carrier in the channel. The mobility of holes, the majority carrier in a P-channel MOS (PMOS) transistor can be increased by applying a compressive longitudinal stress to the channel, especially when the transistor is fabricated on a silicon wafer with surface orientation (100) and the channel orientation coincides with the wafer crystallographic direction [011]. It is well known that a compressive longitudinal stress can be applied to a silicon MOS transistor by embedding a material such as silicon germanium (SiGe) at the ends of the transistor channel. Similarly, the mobility of electrons, the majority carrier in an N-channel MOS (NMOS) transistor can be increased by applying a tensile longitudinal stress to the channel. Such a stress can be applied to a silicon MOS transistor by embedding a material such as silicon doped with carbon at the ends of the transistor channel. Such methods, however, require the etching of trenches into the silicon substrate and the selective epitaxial deposition of silicon germanium and/or silicon carbon. A number of additional and difficult process steps are thus required to implement these know methods to achieve devices having stress enhanced carrier mobility.

Accordingly, it is desirable to provide stress enhanced mobility devices and methods for the fabrication of such devices that avoids the difficult process steps of the prior art. In addition, it especially is desirable to provide NMOS devices having stress enhanced mobility and to provide methods for fabricating NMOS devices having stress enhanced electron mobility. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

A stress enhanced MOS device is provided. In one embodiment the stressed MOS device comprises a T-shaped gate electrode formed of a material having a first Young's modulus. The T-shaped gate electrode includes a first vertical portion and a second horizontal portion. The vertical portion overlies a channel region in an underlying substrate and has a first width; the horizontal portion has a second greater width. A tensile stressed film is formed overlying the second horizontal portion, and a material having a second Young's modulus less than the first Young's modulus fills the space below the second horizontal portion. The tensile stressed film imparts a stress on the horizontal portion of the gate electrode and this stress is transmitted through the vertical portion to the channel of the device. The stress imparted to the channel is amplified by the ratio of the second width to the first width.

Methods are provided for fabricating such stressed MOS devices. The method comprises, in accordance with one embodiment, forming a T-shaped gate electrode overlying a semiconductor substrate. The T-shaped gate electrode comprises a material having a first Young's modulus, and has a base portion of a first width and a top portion of a second width greater than the first width. The first portion is formed overlying a channel region in the semiconductor substrate and the second portion overhangs a space between the second portion and the semiconductor substrate. The method further comprises filling the space between the second portion and the semiconductor substrate with a material having a second Young's modulus less than the first Young's modulus, and depositing a layer of tensile stressed material overlying the top portion.

BRIEF DESCRIPTION OF THE DRAWINGS

The present invention will hereinafter be described in conjunction with the following drawing figures, wherein like numerals denote like elements, and wherein FIGS. 1-6 schematically illustrate, in cross section, a stressed MOS device and method steps for its fabrication in accordance with various embodiments of the invention.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-6 illustrate a semiconductor device, specifically an MOS device 140, and method steps for manufacturing such an MOS device in accordance with various embodiments of the invention. In these illustrative embodiments MOS device 140 is an N-channel MOS (NMOS) transistor, although similar method steps can be used to manufacture a P-channel MOS (PMOS) transistor with appropriate changes in dopant types. Likewise, similar method steps can used to manufacture complementary MOS (CMOS) transistors or a plurality of NMOS and/or PMOS transistors coupled together to implement an integrated circuit. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
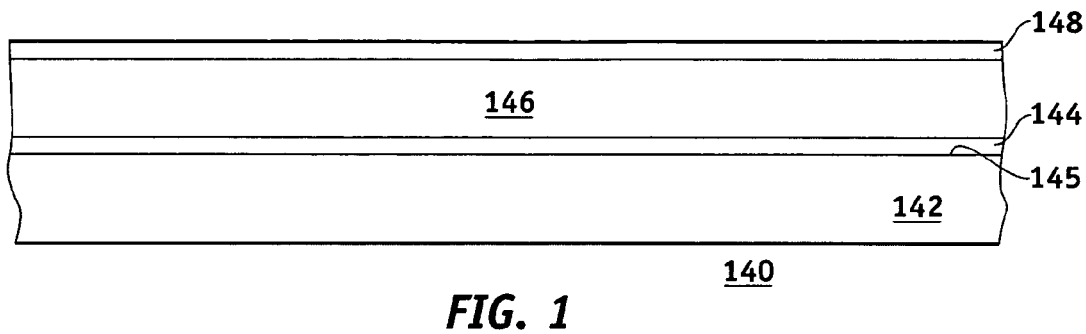

As illustrated in FIG. 1, the manufacture of an MOS device 140 in accordance with an embodiment of the invention begins with providing a semiconductor substrate 142 having a (100) surface crystal orientation. The semiconductor substrate is preferably a silicon substrate wherein the term "silicon substrate" is used herein to encompass the relatively pure silicon materials typically used in the semiconductor industry as well as silicon admixed with other elements such as germanium and the like. Alternatively, the semiconductor substrate can be germanium, gallium arsenide, or other semiconductor material. Silicon substrate 142 may be a bulk silicon wafer as illustrated, or may be (although not illustrated) a thin layer of silicon on an insulating layer (commonly know as a silicon-on-insulator or SOI) that, in turn, is supported by a carrier wafer. A layer of gate insulator 144 is formed on surface 145 of silicon substrate 142. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited in known manner by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically 1-10 nanometers (nm) in thickness. In accordance with one embodiment of the invention a layer of gate electrode forming material 146, preferably polycrystalline silicon, is deposited onto the layer of gate insulator. The layer of polycrystalline silicon is preferably deposited as undoped polycrystalline silicon and is subsequently impurity doped by ion implantation. Other gate electrode forming materials such as refractory metals may also be deposited. A layer 148 of hard mask material such as silicon oxide, silicon nitride, or silicon oxynitride can be deposited onto the surface of the polycrystalline silicon. If the gate electrode material is polycrystalline silicon, that material can be deposited to a thickness of about 100 nm by LPCVD by the hydrogen reduction of silane. The hard mask material can be deposited to a thickness of about 50 nm, also by LPCVD. The gate electrode forming material will hereinafter be referred to as polycrystalline silicon, although those of skill in the art will recognize that other materials can also be employed.

Figure 2:
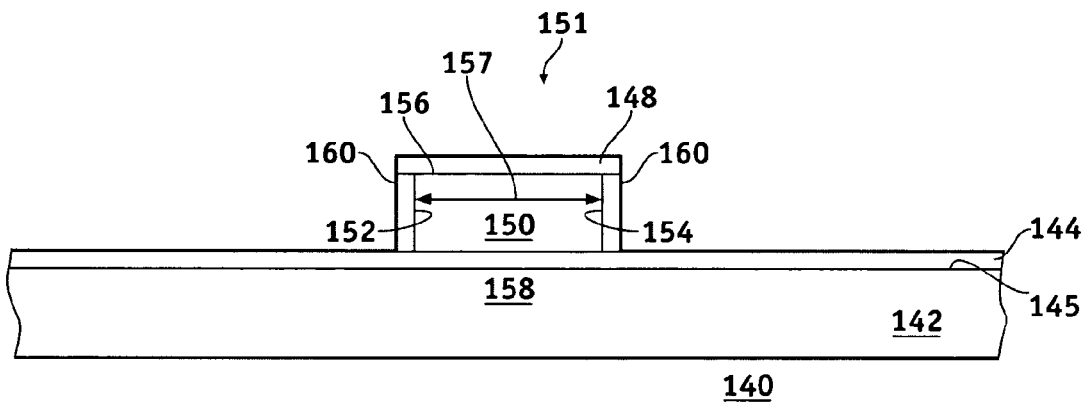

In accordance with one embodiment of the invention hard mask layer 148 and underlying layer of polycrystalline silicon 146 are photolithographically patterned to form a vertical portion 150 of a gate electrode 151 as illustrated in FIG. 2. Vertical portion 150 of gate electrode 151 has opposing sidewalls 152 and 154 and a top 156. Preferably the opposing sidewalls of vertical portion 150 of the gate electrode are separated by a width indicated by double headed arrow 157 that is equal to the minimum line width allowable by the design rules being used to design the integrated circuit of which MOS transistor 140 is a part. Vertical portion 150 of the gate electrode overlies the channel region 158 of MOS transistor 140. Channel region 158 lies at and near surface 145 of silicon substrate 142 and preferably has a longitudinal direction oriented along the [110] crystal direction. The polycrystalline silicon can be etched in the desired pattern by, for example, plasma etching in a Cl or HBr/$O_2$ chemistry and the hard mask can be etched, for example, by plasma etching in a $CHF_3$, $CF_4$, or $SF_6$ chemistry. Following the patterning of the gate electrode, a thin layer 160 of silicon oxide is preferably thermally grown on the sidewalls of the gate electrode by heating the patterned polycrystalline silicon in an oxidizing ambient. Layer 160 can be grown to a thickness of about 2-5 nm.

Figure 3:
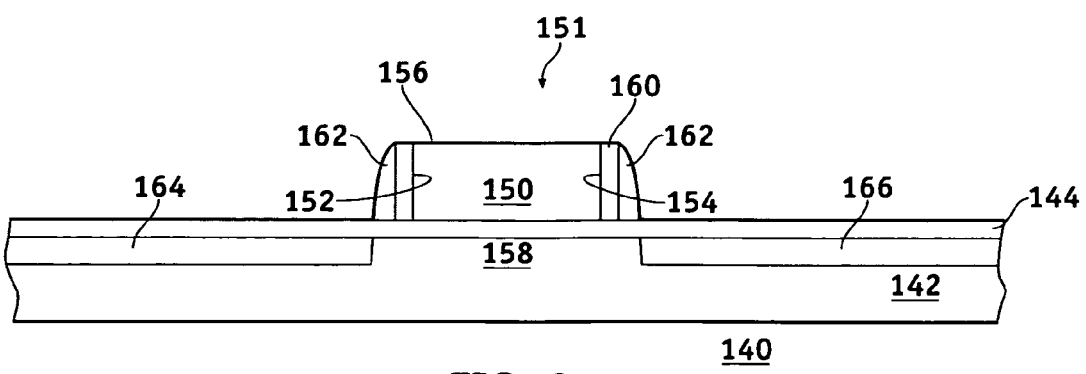

In accordance with an embodiment of the invention a layer of spacer forming material is deposited over thin layer 160 of silicon oxide. The layer of spacer forming material can be, for example, a silicon oxide, silicon nitride, silicon oxynitride, polycrystalline silicon, or the like as is well known. Preferably the layer of spacer forming material is silicon nitride. The layer of spacer forming material is anisotropically etched to form sidewall spacers 162 over oxide layer 160 on opposing sidewalls 152 and 154 of vertical portion 150 of gate electrode 151 as illustrated in FIG. 3. The layer of spacer forming material can be etched in well known manner, for example by reactive ion etching (RIE) using a $C_xF_y$ chemistry. Sidewall spacers 162 are used as ion implantation masks to mask the implantation of conductivity determining ions into surface 145 and near surface regions of substrate 142 to form at least a portion of the source 164 and drain 166 regions of MOS transistor 140, with the source and drain regions self aligned with gate electrode 151 and channel region 158. For the fabrication of an NMOS transistor, either phosphorous or arsenic ions can be implanted. For the fabrication of a PMOS transistor boron, in one of its ionic species, can be implanted. It is well known that one or more sidewall spacers can be employed as ion implantation masks to form one or more implanted regions collectively making up the source and drain regions of MOS transistor 140. Such implanted regions can form, for example, source/drain extension regions, buffer regions and contact regions. Because such regions and the methods for their fabrication are well known in the art, they need not be described here or illustrated in the figures.

Figure 4:
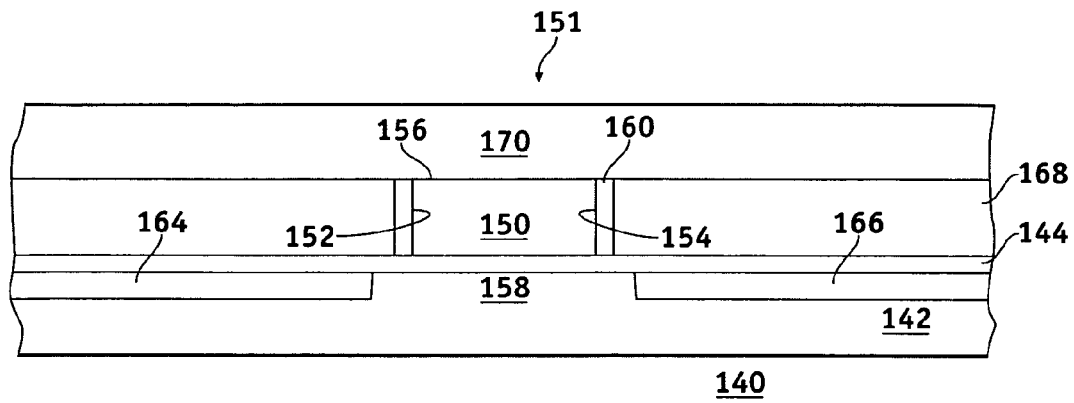

In accordance with one embodiment of the invention sidewall spacers 162 are removed, for example by plasma etching, and a layer 168 of silicon dioxide or other soft material is blanket deposited to cover vertical portion 150 of gate electrode 151 and source 164 and drain 166 regions of MOS transistor 140. The definition of the term "soft" material will become apparent from the following discussion. A portion of layer 168 is removed, for example by chemical mechanical polishing or planarization (CMP), to expose top 156 of gate electrode 151 as illustrated in FIG. 4. The method in accordance with the invention continues by depositing a layer 170 of a hard gate electrode forming material over layer 168 of soft material and in contact with top 156 of vertical portion 150 of gate electrode 151. The hard gate electrode forming material can be, for example, polycrystalline silicon. Other materials that are either conductive or that can be made conductive can also be used in place of polycrystalline silicon. It is preferred, but not necessary, that the same material be used for layer 170 and for vertical portion 150 of gate electrode 151. The "hard" material preferably has a Young's modulus at least twice that of the "soft" material. For example, polycrystalline silicon, a "hard" material, has a Young's modulus of about 166 Giga Pascals (GPa) and deposited silicon dioxide, a "soft" material, has a Young's modulus of about 60 GPa. Examples of other soft materials that can be used in this application include, for example, silica glass doped with phosphorus and/or boron (PSG, BSG, or BPSG) and porous dielectric materials.

Figure 5:
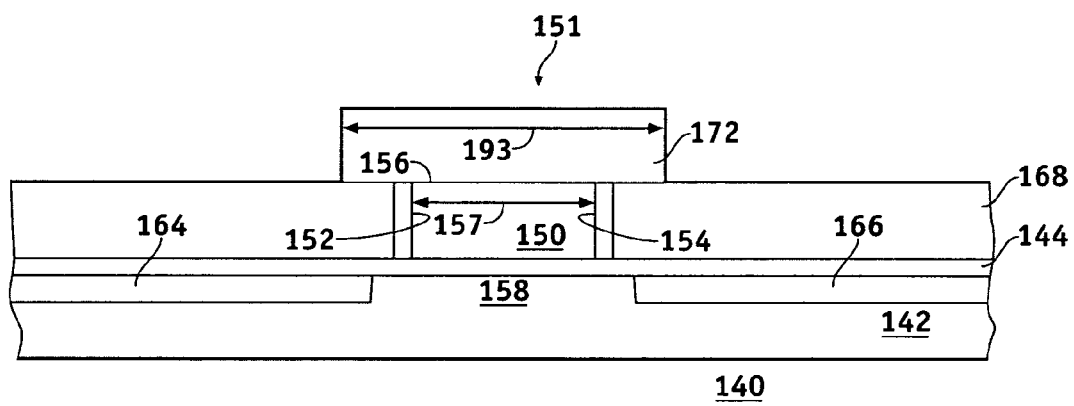

As illustrated in FIG. 5 layer 170 of hard gate electrode forming material is photolithographically patterned and etched to form a horizontal portion 172 of gate electrode 151 in physical and electrical contact with top 156. Horizontal portion 172 of gate electrode 151 has a width indicated by double headed arrow 193 that is greater than the width (indicated by double headed arrow 157) of vertical portion 150. It is not essential that horizontal portion 172 be precisely aligned and centered over vertical portion 150, but the horizontal portion must be wider than the vertical portion and must contact the vertical portion. Together, horizontal portion 172 and vertical portion 150 form a T-shaped gate electrode

151. Layer 168 of soft material forms a soft spacer adjacent opposing sidewalls 152 and 154 and filling the space beneath horizontal portion 172.

Figure 6:
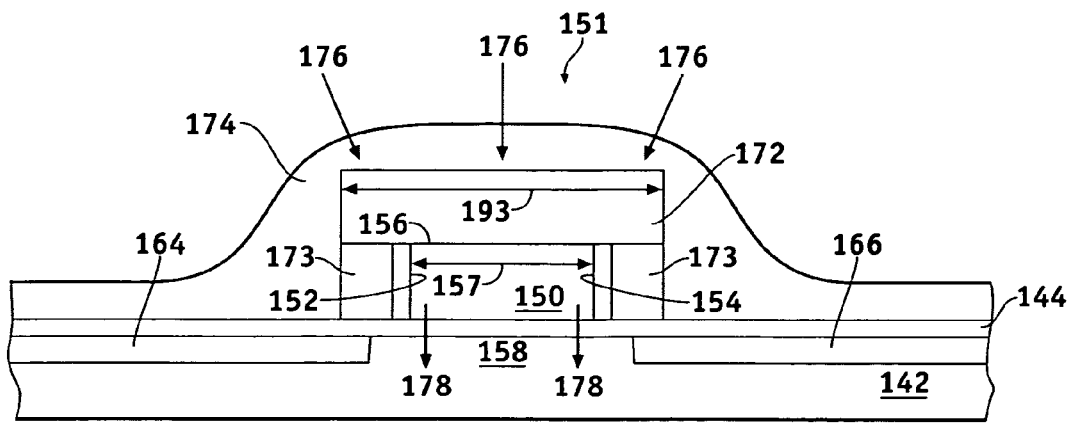

In accordance with one embodiment of the invention horizontal portion 172 of gate electrode 151 is used as an etch mask and at least a portion of the layer of soft material is anisotropically etched to form a soft material sidewall spacer 173 adjacent opposing sidewalls 152 and 154 of vertical portion 150 of gate electrode 151. A layer of high tensile stress material 174 is blanket deposited over the top of T-shaped gate electrode 151 and sidewall spacers 173 formed from the remaining portion of layer 168 of soft material as illustrated in FIG. 6. The layer of high tensile stress material, which forms a contact liner on the horizontal portion of gate electrode 151, can be, for example, a layer of silicon nitride deposited by LPCVD. Such a silicon nitride layer can have a tensile stress of about 1 GPa. The tensile stress of layer 174 exerts a downward stress on horizontal portion 172 of gate electrode 151 as indicated by arrows 176. The downward stress 176 exerted on horizontal portion 172 is transmitted to vertical portion 150 and, in turn, to channel region 158. The vertical stress on channel region 158, indicated by arrow 178, increases the mobility of majority carrier electrons in an NMOS transistor. Because downward stress 176 is exerted on horizontal portion 172 formed of a hard material and having a greater width than vertical portion 150, and because, in accordance with an embodiment of the invention, the space under horizontal portion 172 is filled with a soft material, the stress exerted on channel region 158 is increased in comparison to the stress that would be exerted by layer 174 on a conventionally shaped gate electrode. The increase in stress exerted on the channel region because of the T-shape of gate electrode 151 is proportional to the ratio of the widths of the horizontal and vertical portions of the gate electrode.

The portions of layer 174 that are in contact with the surface 145 of source and drain regions 164 and 166 also exert a longitudinal (horizontal) tensile stress on channel region 158. The longitudinal tensile stress increases the mobility of electrons, but degrades the mobility of holes. Sidewall spacers 173 increase the separation of the portions of layer 174 in contact with the source and drain regions from the channel region in contrast to the spacing that would be seen in a conventional MOS device with a conventionally shaped gate electrode. Consequently, the tensile longitudinal stress in the channel region 158 is decreased in comparison to the tensile longitudinal stress that would be exerted by layer 174 on the channel of an MOS device having a conventionally shaped gate electrode. The resulting mobility of electrons in channel regions 158 of NMOS transistors remains increased because the mobility of electrons n the channel is more sensitive to vertical stresses than to the longitudinal stress.

A tensile longitudinal stress on the channel of an MOS transistor increases the mobility of electrons in an NMOS transistor, but decreases the mobility of holes in a PMOS transistor. Accordingly, in fabricating a conventional MOS device, tensile stressed layer 174 is preferably selectively removed from PMOS devices to prevent the mobility degradation of holes, the major carriers of PMOS transistors. Selectively removing layer 174, however, increases the complexity of the fabrication process. In accordance with the present invention, the longitudinal tensile stress in channel region 158 caused by layer 174 is reduced because of the increased spacing caused by the shape of the gate electrode, so tensile stressed layer 174 may be left on PMOS devices without significant mobility degradation of holes.

Figure 7:
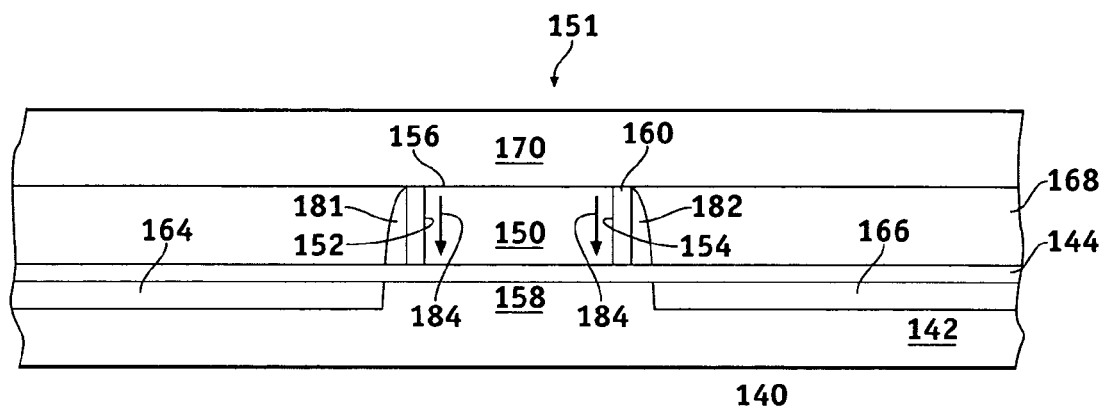
FIGS. 7 and 8 schematically illustrate, in cross section, a stressed MOS device fabricated in accordance with a further embodiment of the invention.
Figure 8:
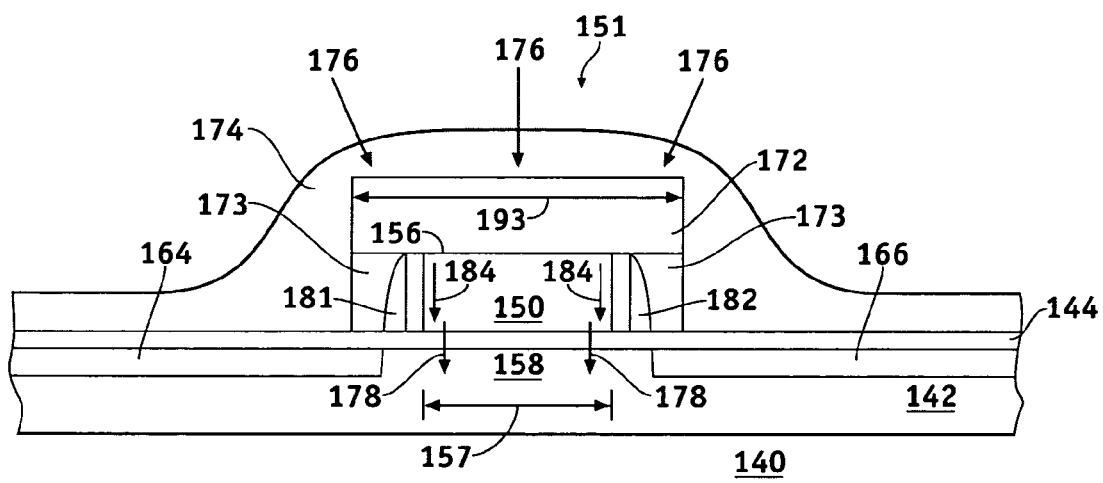

In accordance with a further embodiment of the invention a method for fabricating a stressed MOS device proceeds in the same manner as illustrated in FIGS. 1-3. After removing sidewall spacers 162, spacers 181 and 182 are formed on opposing sidewalls 152 and 154 of vertical portion 150 as illustrated in FIG. 7. Sidewall spacers 181 and 182 are formed of a material such as silicon nitride deposited by LPCVD that has a high tensile stress. The sidewall spacers can be formed in known manner by blanket depositing a layer of silicon nitride or other tensile stressed material and subsequently anisotropically etching the layer to remove the layer from all horizontal surfaces. The tensile stress in the sidewall spacers exerts a downward stress on vertical portion 150 of gate electrode 151 as indicated by arrows 184. The vertical stress indicated by arrows 184 applies a vertical stress to channel region 158 which increases the mobility of carriers in the channel region. The method in accordance with this embodiment of the invention continues with the blanket deposition of a layer 168 of soft material that covers sidewall spacers 181 and 182, source 164 and drain 166 regions, and vertical portion 150 of gate electrode 151. A portion of layer 168 is removed, for example by CMP, to expose top 156 of vertical portion 150 of gate electrode 151. A layer of hard gate electrode forming material 170 is deposited over the remaining portion of layer 168 and contacting the top of the gate electrode. The method then continues with the same steps illustrated in FIGS. 5 and 6 to achieve the device structure illustrated in FIG. 8. The vertical stress exerted on the channel region by tensile stressed sidewall spacers 181 and 182 is combined with the vertical stress exerted on the channel region by tensile stressed layer 174 conveyed through horizontal portion 172 and vertical portion 150 of gate electrode 151.

Stressed MOS device 140 can be completed by well known steps (not illustrated) such as depositing a layer of dielectric material, etching opening through the dielectric material to expose portions of the source and drain regions, and forming metallization that extends through the openings to electrically contact the source and drain regions. Further layers of interlayer dielectric material, additional layers of interconnect metallization, and the like may also be applied and patterned to achiever the proper circuit function of the integrated circuit being implemented.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stressed MOS device comprising the steps of:

forming a gate insulator layer overlying a surface of a semiconductor substrate;

depositing a layer of gate electrode material having a first Young's modulus onto the gate insulator layer;

patterning the layer of gate electrode material to form a first portion of a gate electrode having a top and having opposing sidewalls spaced apart by a first width;

depositing a layer of spacer forming material and etching the layer of spacer forming material to form spacers adjacent the opposing sidewalls;

ion implanting conductivity determining ions to form at least a portion of a source region and at least a portion of a drain region using the spacers as ion implantation masks;
removing the spacers;
depositing a layer of material having a second Young's modulus less than the first Young's modulus overlying the first portion of the gate electrode and the portion of the source region and the portion of the drain region;
removing a portion of the layer of material to expose the top of the first portion of the gate electrode;
depositing a second layer of gate electrode material overlying the layer of material and contacting the top of the first portion of the gate electrode;
patterning the second layer of gate electrode material to form a second portion of the gate electrode contacting the top of the first portion of the gate electrode, the second portion having a second width greater than the first width; and
depositing a tensile contact liner overlying the second portion of the gate electrode.

2. The method of claim 1 wherein the step of depositing a layer of gate electrode material comprises the step of depositing a layer of polycrystalline silicon and the step of depositing a layer of material comprises the step of depositing a layer of silicon oxide.

3. The method of claim 1 further comprising the step of depositing a layer of silicon nitride prior to the step of depositing a layer of material and wherein the step of removing a portion of the layer of material further includes the step of removing a portion of the layer of silicon nitride.

4. The method of claim 1 wherein the step of depositing a tensile contact liner comprises the step of depositing a layer of silicon nitride by a process of LPCVD.

* * * * *